United States Patent
Nag

(10) Patent No.: US 12,166,515 B2
(45) Date of Patent: Dec. 10, 2024

(54) REFERENCE SIGNAL GENERATION FOR POWER AMPLIFIERS OF RF TRANSMITTERS AND TRANSCEIVERS

(71) Applicant: Huawei Technologies Co., Ltd., Shenzhen (CN)

(72) Inventor: Manbir Nag, Oakridge, NC (US)

(73) Assignee: Huawei Technologies Co., Ltd., Shenzhen (CN)

( * ) Notice: Subject to any disclaimer, the term of this patent is extended or adjusted under 35 U.S.C. 154(b) by 350 days.

(21) Appl. No.: 17/687,455

(22) Filed: Mar. 4, 2022

(65) Prior Publication Data

US 2022/0190853 A1 Jun. 16, 2022

Related U.S. Application Data

(63) Continuation of application No. PCT/US2019/049799, filed on Sep. 5, 2019.

(51) Int. Cl.
*H04B 1/04* (2006.01)
*H03F 3/195* (2006.01)
(Continued)

(52) U.S. Cl.
CPC .......... *H04B 1/0475* (2013.01); *H03F 3/195* (2013.01); *H03F 3/245* (2013.01); *H03G 3/3042* (2013.01);
(Continued)

(58) Field of Classification Search
CPC . H04B 1/0475; H04B 2001/045; H03F 3/195; H03F 3/245; H03F 2200/451;
(Continued)

(56) References Cited

U.S. PATENT DOCUMENTS

2011/0084681 A1 4/2011 Herbst
2014/0049245 A1* 2/2014 Kim .................. G05F 1/468
323/314

(Continued)

FOREIGN PATENT DOCUMENTS

WO WO2015/108755 A1 7/2015

OTHER PUBLICATIONS

International Search Report & The Written Opinion of the International Searching Authority dated Jul. 9, 2020, International Application No. PCT/US2019/049799.

(Continued)

*Primary Examiner* — Angelica Perez
(74) *Attorney, Agent, or Firm* — Vierra Magen Marcus LLP

(57) ABSTRACT

Subsystems and methods disclosed herein provide a reference signal to a power amplifier (PA) of an RF transmitter or transceiver. PTAT and CTAT signals and a temperature indication signal are produced. Based on the temperature indication signal, one of the PTAT or CTAT signals is selected to be used to produce one or more DAC reference signals. Using the selected one of the PTAT or CTAT signals, the one or more DAC reference signals are produced and used to bias the DAC. A multi-bit digital input signal is converted to an analog output signal using the DAC that is biased using the one or more DAC reference signals (produced using the selected one of the PTAT or CTAT signals). Further, the analog signal output by the DAC, or an amplified version thereof, is used as the reference signal that is provided to the PA of the RF transmitter or transceiver.

15 Claims, 10 Drawing Sheets

(51) Int. Cl.
*H03F 3/24* (2006.01)
*H03G 3/30* (2006.01)

(52) U.S. Cl.
CPC .. *H03F 2200/451* (2013.01); *H03F 2200/468* (2013.01); *H04B 2001/045* (2013.01)

(58) Field of Classification Search
CPC ... H03F 2200/468; H03G 3/3042; G05F 3/30; G05F 3/245
See application file for complete search history.

(56) References Cited

U.S. PATENT DOCUMENTS

| | | | |
|---|---|---|---|
| 2018/0131326 A1* | 5/2018 | Raghavan | H03F 3/245 |
| 2019/0033907 A1 | 1/2019 | Raghavan et al. | |
| 2019/0101948 A1* | 4/2019 | Eberlein | G05F 3/225 |

OTHER PUBLICATIONS

International Preliminary Report on Patentability dated Mar. 17, 2022, International Application No. PCT/US2019/049799.

* cited by examiner

US 12,166,515 B2

REFERENCE SIGNAL GENERATION FOR POWER AMPLIFIERS OF RF TRANSMITTERS AND TRANSCEIVERS

PRIORITY CLAIM

This application is a continuation of PCT Patent Application No. PCT/US2019/049799, filed Sep. 5, 2019, by Nag, titled "REFERENCE SIGNAL GENERATION FOR POWER AMPLIFIERS OF RF TRANSMITTERS AND TRANSCEIVERS," which is incorporated herein by reference in its entirety.

FIELD

The disclosure generally relates to radio frequency (RF) transmitters and transceivers that include one or more power amplifiers (PAs), and to reference signal generators that produce one or more reference signals that are provided to one or more PAs of an RF transmitter or transceiver.

BACKGROUND

Radio frequency (RF) transmitters or transceivers included in user equipment (UE) or base stations (BSs) of wireless networks often include one or more power amplifiers (PAs) used to amplify voice and/or data signals before they are transmitted from UE to a BS, or vice versa. Multiple such PAs (e.g., two or three PAs), which can also be referred to more specifically as RF PAs, are often used to provide for multiple (e.g., two or three) stages of power amplification. For various reasons, the gain of an RF PA may vary over time, e.g., due to changes in temperature, which can lead to undesirable output distortion in transmitted signals. It is desirable to reduce and preferably minimize such output distortion.

BRIEF SUMMARY

According to one aspect of the present disclosure, a subsystem is configured to produce a reference signal that is provided to a power amplifier (PA) of a radio frequency (RF) transmitter or transceiver. The subsystem comprises one or more circuits configured to produce a proportional to absolute temperature (PTAT) signal and a complimentary to absolute temperature (CTAT) signal. The subsystem also includes a digital-to-analog converter (DAC), a DAC reference signal generator, a temperature sensor, and a switch. The DAC includes a digital input, one or more reference inputs, and an analog output. The DAC is configured to receive (at the digital input of the DAC) a multi-bit digital input signal, receive (at the one or more reference inputs of the DAC) one or more analog DAC reference signals, and output (at the analog output of the DAC) an analog output signal that the DAC produces based on the multi-bit digital input signal and the one or more DAC reference signals. The analog output signal (that is output at the analog output of the DAC) or an amplified version thereof comprises the reference signal that is provided to the PA. The DAC reference signal generator is configured to produce, based on one of the PTAT or CTAT signals, the one or more DAC reference signals that are provided to the one or more reference inputs of the DAC. The temperature sensor is configured to produce a temperature indication signal. The switch is configured to provide one of the PTAT signal or the CTAT signal to the DAC reference signal generator based on the temperature indication signal.

Optionally, in any of the preceding aspects, switch comprises a multiplexer, or a single pole double throw switch.

Optionally, in any of the preceding aspects, the switch provides the PTAT signal to the DAC reference signal generator when the temperature indication signal is indicative of a temperature sensed by the temperature sensor being below a threshold temperature; and the switch provides the CTAT signal to the DAC reference signal generator when the temperature indication signal is indicative of the temperature sensed by the temperature sensor being above the threshold temperature.

Optionally, in any of the preceding aspects, the temperature sensor is configured to cause the temperature indication signal to have one of two binary states based on whether the sensed temperature is below or above the threshold temperature.

Optionally, in any of the preceding aspects, a gain of the PA varies in dependence on a change in a temperature of the PA. Beneficially, use of the temperature indication signal to selectively provide one of the PTAT or CTAT signals to the DAC reference signal generator reduces how much the gain of the PA varies in dependence on the change in the temperature of the PA compared to if a same one of the PTAT or CTAT signals was always provided to the DAC reference signal generator.

Optionally, in any of the preceding aspects, the one or more circuits configured to produce the PTAT and CTAT signals comprise a bandgap reference circuit that produces both the PTAT and CTAT signals.

Optionally, in any of the preceding aspects, the temperature sensor comprises at least a portion of the bandgap reference circuit that produces both the PTAT and CTAT signals.

Optionally, in any of the preceding aspects, the one or more circuits configured to produce the PTAT and CTAT signals comprise a first circuit configured to produce the PTAT signal and a second circuit configured to produce the CTAT signal.

According to one aspect of the present disclosure, a method provides a reference signal to a power amplifier (PA) of a radio frequency (RF) transmitter or transceiver. The method comprises producing a PTAT signal and a CTAT signal; producing a temperature indication signal; and selecting, based on the temperature indication signal, which one of the PTAT or CTAT signals is to be used to produce one or more DAC reference signals that are used to bias a DAC. The method also includes producing, using the selected one of the PTAT or CTAT signals, the one or more DAC reference signals that are used to bias the DAC; and biasing the DAC using the one or more DAC reference signals produced using the selected one of the PTAT or CTAT signals. The method further includes converting a multi-bit digital input signal to an analog output signal using the DAC that is biased using the one or more DAC reference signals produced using the selected one of the PTAT or CTAT signals; and using the analog signal that is output by the DAC, or an amplified version thereof, as the reference signal that is provided to (and used to bias) the PA of the RF transmitter or transceiver. In certain embodiments, PTAT and CTAT signals are produced simultaneously. In other embodiments, only one of a PTAT signal or a CTAT signal is produced at a time, depending upon whether the temperature indication signal is indicative of a sensed temperature being above or below a threshold.

Optionally, in any of the preceding aspects, the selecting is performed using a switch that is controlled based on the temperature indication signal.

Optionally, in any of the preceding aspects, the selecting comprises: selecting the PTAT signal when the temperature indication signal is indicative of a temperature sensed by the temperature sensor being below a threshold temperature; and selecting the CTAT when the temperature indication signal is indicative of the temperature sensed by the temperature sensor being above the threshold temperature. Alternatively, the selecting can comprise: selecting the CTAT signal when the temperature indication signal is indicative of a temperature sensed by the temperature sensor being below a threshold temperature; and selecting the PTAT when the temperature indication signal is indicative of the temperature sensed by the temperature sensor being above the threshold temperature. More generally, one of a PTAT signal or a CTAT signal can be selected when the temperature indication signal is indicative of a temperature sensed by the temperature sensor being below a threshold temperature, and the other one of the PTAT or CTAT signals can be selected when the temperature indication signal is indicative of the temperature sensed by the temperature sensor being above the threshold temperature.

Optionally, in any of the preceding aspects, producing the temperature indication signal comprises sensing a temperature and causing the temperature indication signal to have one of two binary states based on whether the sensed temperature is below or above the threshold temperature.

Optionally, in any of the preceding aspects, a gain of the PA varies in dependence on a change in a temperature of the PA. Beneficially, selecting, based on the temperature indication signal, which one of the PTAT or CTAT signals is to be used to produce one or more DAC reference signals that are used to bias the DAC reduces how much the gain of the PA varies in dependence on the change in the temperature of the PA compared to if a same one of the PTAT or CTAT signals was always used to produce the one or more DAC reference signals.

Optionally, in any of the preceding aspects, producing the PTAT and CTAT signals is performed using a same bandgap reference circuit.

Optionally, in any of the preceding aspects, producing the PTAT and CTAT signals is performed using a first circuit that produces the PTAT signal and a second circuit that produces the CTAT signal.

According to one aspect of the present disclosure, a transmitter or transceiver comprises a processor, a DAC, a mixer, one or more power amplifiers (PAs), and one or more circuits configured to produce a PTAT signal and CTAT signal. The processor is configured to output a voice and/or data signal. The DAC is configured to convert the voice and/or data signal from a digital signal to an analog signal. The mixer is downstream of the DAC and configured to upconvert the analog voice and/or data signal, or a filtered version thereof, from a baseband signal to an RF signal. The one or more PAs downstream of the mixer is/are configured to amplify the RF signal before the RF signal, or a filtered version thereof, is provided to an antenna for transmission. The temperature sensor is configured to produce a temperature indication signal. Each PA, of the one or more PAs, is configured to receive a respective reference signal that affects a gain of the PA. The respective reference signal that is provided to each PA, of the one or more PAs, is produced using one of the PTAT or CTAT signals. At any given time, the one of the PTAT or CTAT signals that is used to produce the respective reference signal that is provided to each PA, of the one or more PAs, is selected based on the temperature indication signal produced by the temperature sensor.

Optionally, in any of the preceding aspects, the transmitter or transceiver further comprises circuitry configured to produce, based on one of the PTAT signal or the CTAT signal, the one or more reference signals provided to the one or more PAs; and a switch configured to select, based on the temperature indication signal, which one of the PTAT signal or the CTAT signal is provided to the circuitry configured to produce the one or more reference signals provided to the one or more PAs.

Optionally, in any of the preceding aspects, when the temperature indication signal is indicative of a temperature sensed by the temperature sensor being below a threshold temperature, the switch provides one of the PTAT or CTAT signals to the circuitry configured to produce the one or more reference signals provided to the one or more PAs; and when the temperature indication signal is indicative of the temperature sensed by the temperature sensor being above the threshold temperature, the switch provides the other one of the PTAT or CTAT signals to the circuitry configured to produce the one or more reference signals provided to the one or more PAs.

Optionally, in any of the preceding aspects, the temperature sensor is configured to cause the temperature indication signal to have one of two binary states based on whether a sensed temperature is below or above the threshold temperature.

Optionally, in any of the preceding aspects, the one or more circuits configured to produce the PTAT signal and the CTAT signal comprises a bandgap reference circuit; and the temperature sensor comprises at least a portion of the bandgap reference circuit that produces the PTAT and CTAT signals.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate like elements.

DETAILED DESCRIPTION

Figure 1:
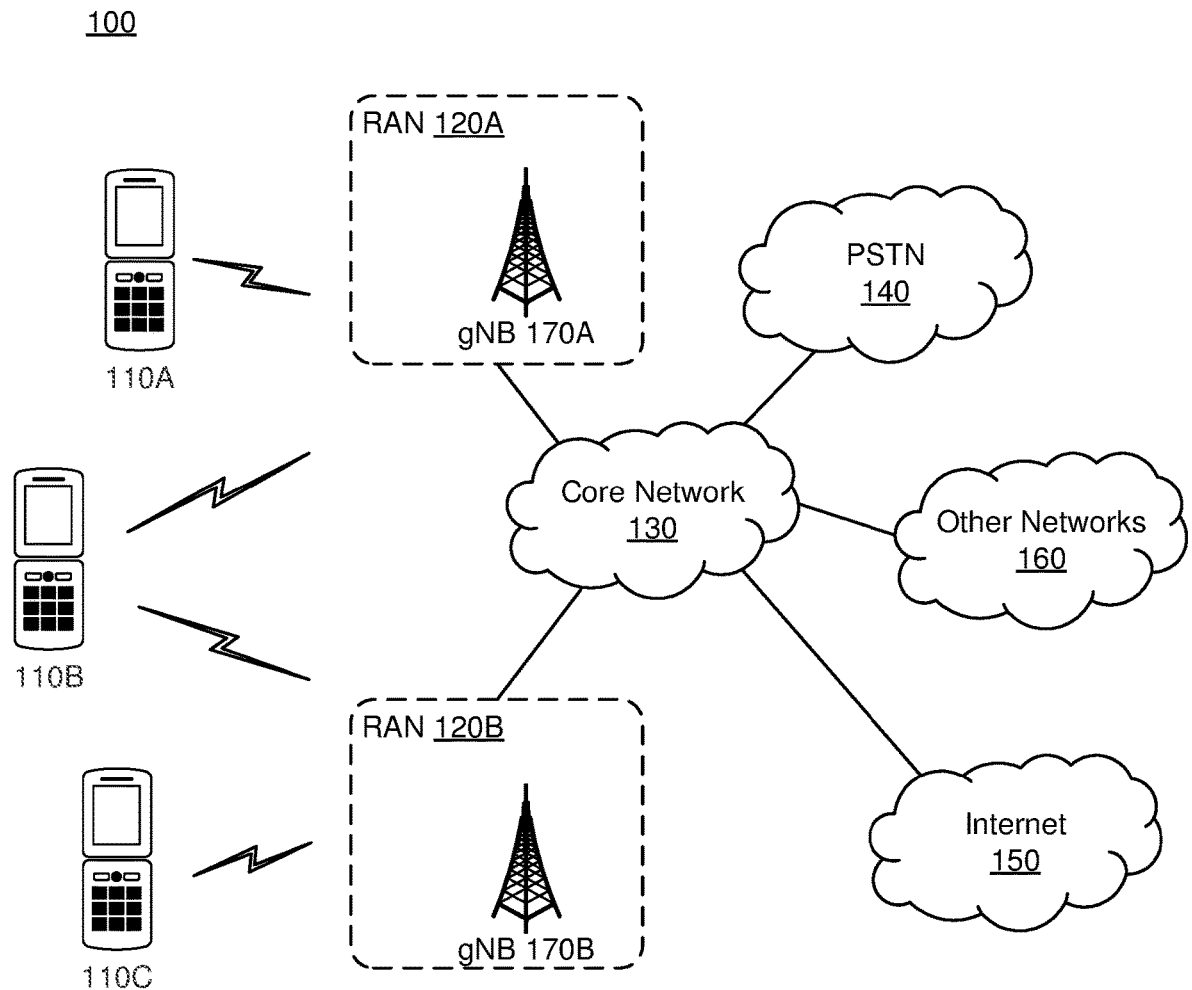
FIG. 1 illustrates an example of a wireless network for communicating data.

The present disclosure will now be described with reference to the figures, which in general relate to reference signal generators configured to produce a reference signal that is provided to a power amplifier (PA) of a radio frequency (RF) transmitter or transceiver, and to methods for providing a reference signal to a PA of an RF transmitter or transceiver. Embodiments of the present technology also relate to transmitters and transceivers that include a reference signal generator and one or more PAs that receive one or more reference signals from the reference signal generator. As noted above, for various reasons, the gain of an RF PA may vary over time, e.g., due to changes in temperature, which can lead to undesirable output distortion in transmitted signals.

Where an RF transmitter or transceiver includes multiple PAs (e.g., connected in series, one after the other), each of these PAs should be biased using a respective reference signal such that each PA operates in its most linear region so that distortion in a transmitted signal is minimized. Output distortion can be minimized when the gain of the RF PA is constant over a wide output power (Pout) range. When the RF PA gain reduces versus Pout, the RF PA is said to enter into a state of compression and distortion will start increasing. In order to keep the RF PA gain constant over a wide range of Pout, a reference current (or voltage) signal can be a proportional (PTAT) or complementary (CTAT) or constant bandgap (BG) function of temperature depending on the particular RF PA design. Specific embodiments of the present technology described herein don't always rely on just a same one of a PTAT or CTAT signal to generate a reference signal for a PA, but rather, select between using a PTAT or CTAT signal to generate the reference signal for the PA, wherein the selection is based on a sensed temperature, as will be described in additional detail below. Such embodiments can be used in transmitters and transceivers that are designed for use with 5G wireless networks, but are not limited thereto. For example, such embodiments can also be used in transmitters and transceivers that use any RF modulation scheme that requires linear RF PAs, such as but not limited to, 3G, 4G, WiFi and Bluetooth.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 2:
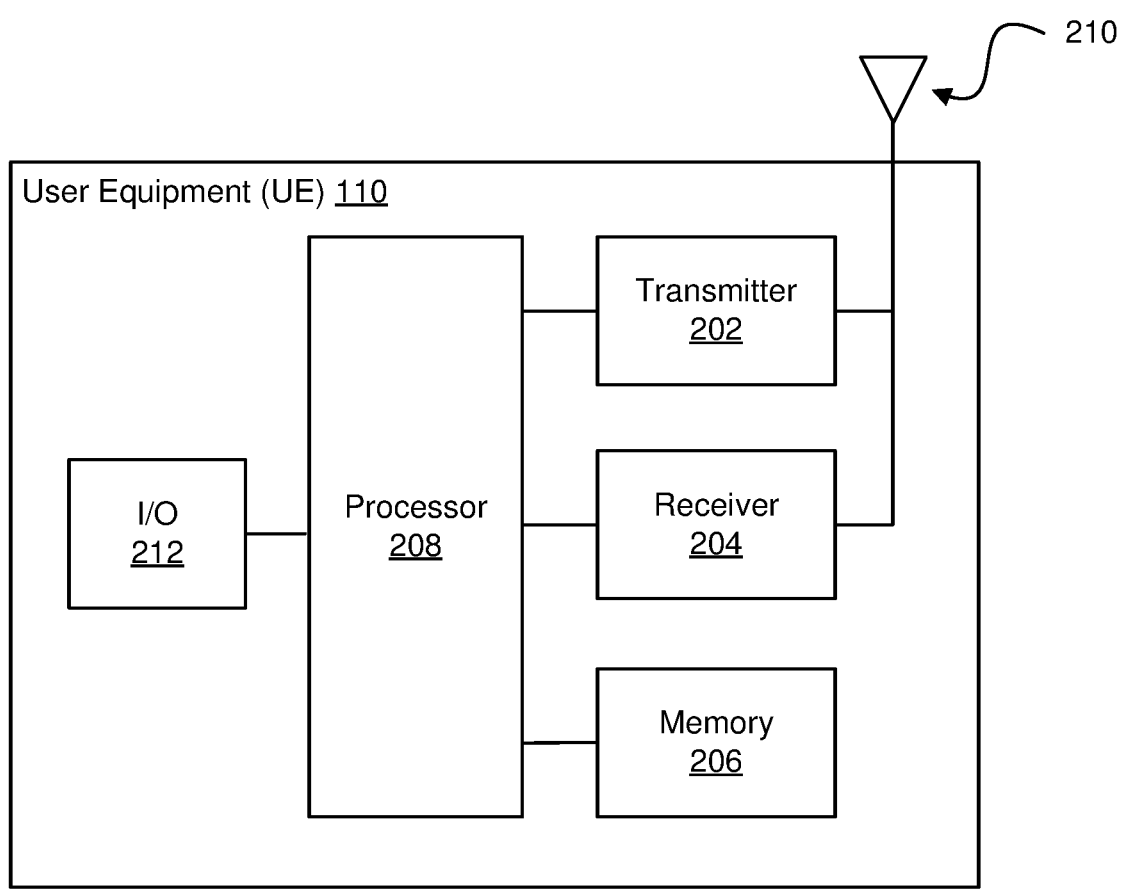
FIG. 2 illustrates example details of an instance of user equipment (UE) introduced in FIG. 1.
Figure 3:
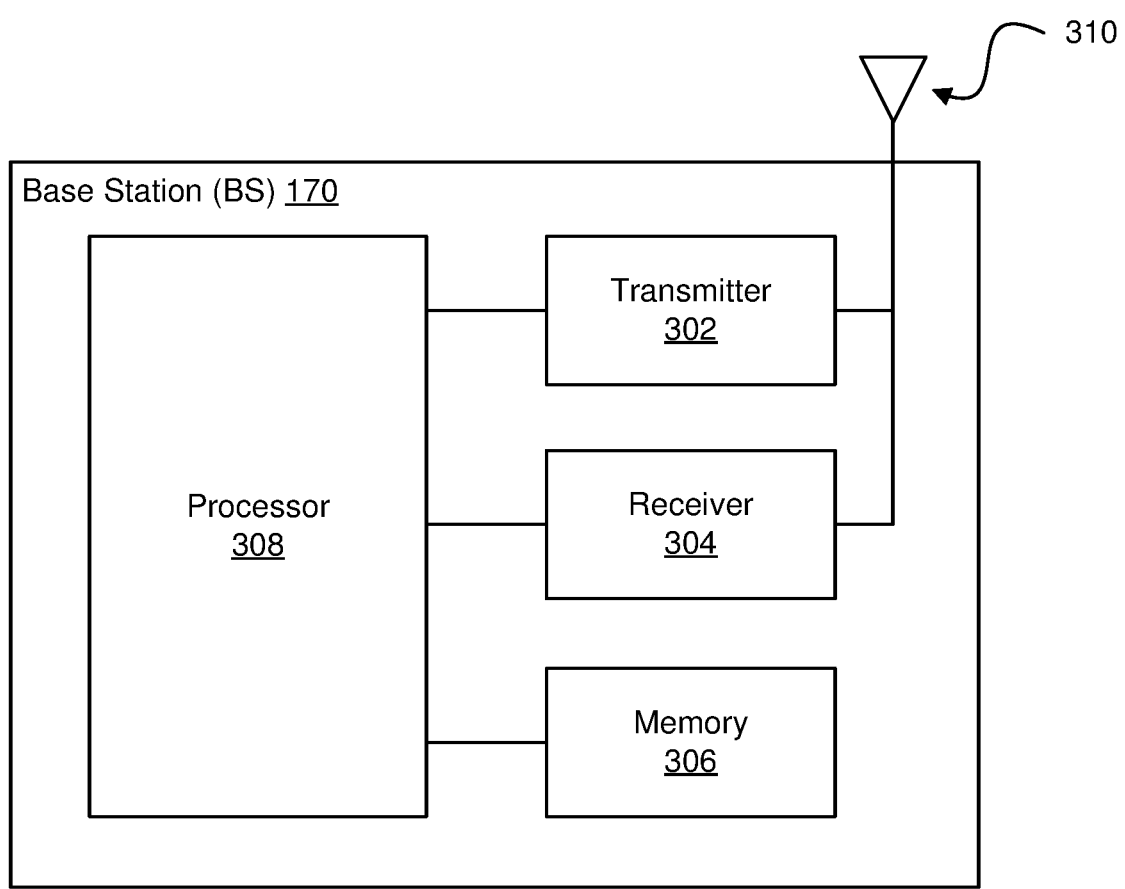
FIG. 3 illustrates example details of an instance of a base station (BS) introduced in FIG. 1.
Figure 4:
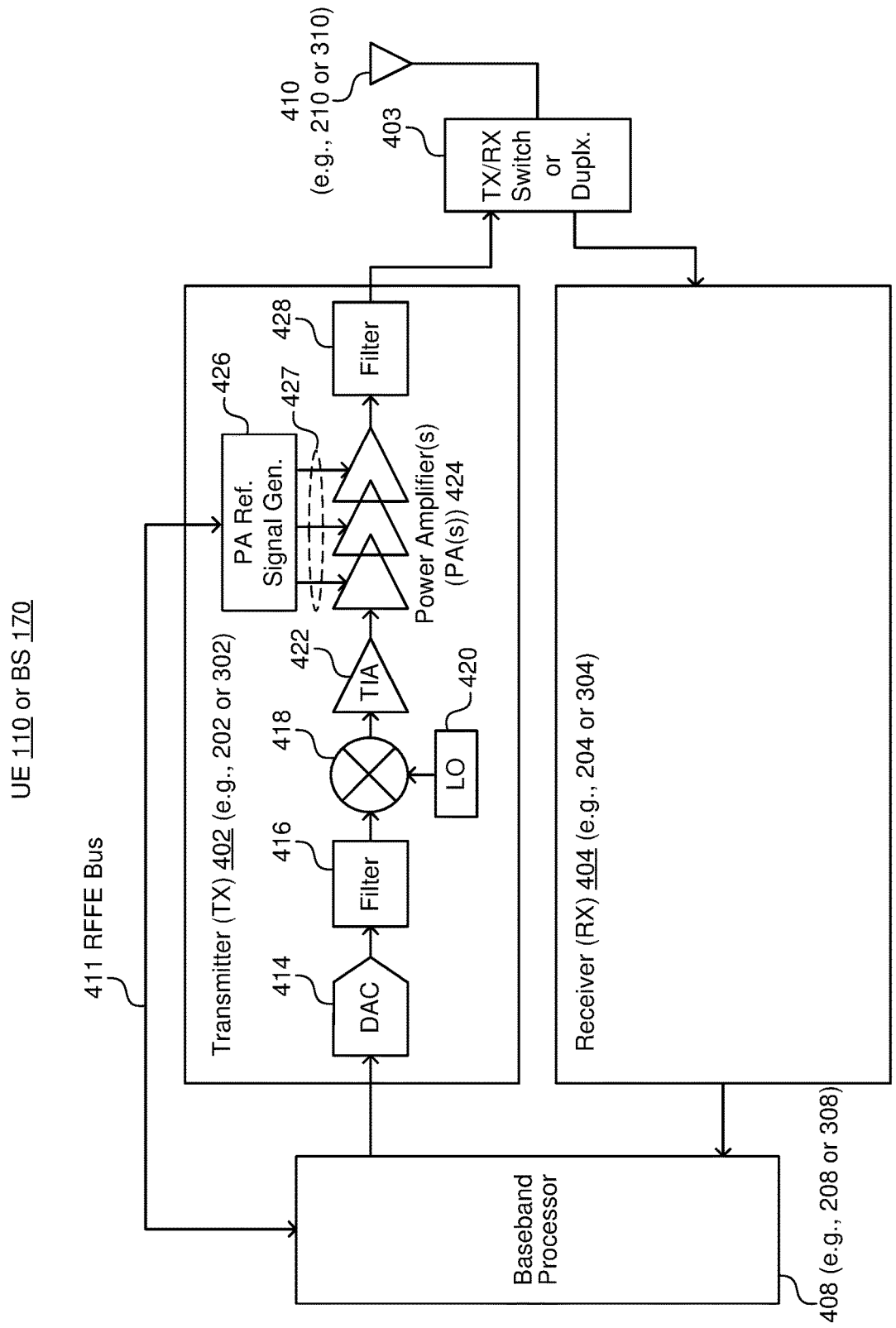
FIG. 4 illustrates example details of a transmitter included in UE or a BS shown in FIGS. 2 and 3.

Before provided additional details of specific embodiments of the present technology, FIG. 1 is used to describe an example of a wireless network for communicating data, FIG. 2 is used to describe example details of an instance of user equipment (UE) introduced in FIG. 1, and FIG. 3 is used to describe example details of an instance of a base station (BS) introduced in FIG. 1. Additionally, FIG. 4 is used to describe example details of a transmitter included UE or a BS.

Referring to FIG. 1, illustrated therein is an example of a wireless network for communicating data. The communication system 100 includes, for example, user equipment 110A, 110B, and 110C, radio access networks (RANs) 120A and 120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 milliseconds (e.g. 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A, 110B, and 110C, which can be referred to individually as a UE 110, or collectively as the UEs 110, are configured to operate and/or communicate in the system 100. For example, a UE 110 can be configured to transmit and/or receive wireless signals or wired signals. Each UE 110 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A, 120B include one or more base stations (BSs) 170A, 170B, respectively. The RANs 120A and 120B can be referred to individually as a RAN 120, or collectively as the RANs 120. Similarly, the base stations (BSs) 170A and 170B can be referred to individually as a base station (BS) 170, or collectively as the base stations (BSs) 170. Each of the BSs 170 is configured to wirelessly interface with one or more of the UEs 110 to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 170A forms part of the RAN 120A, which may include one or more other BSs 170, elements, and/or devices. Similarly, the BS 170B forms part of the RAN 120B, which may include one or more other BSs 170, elements, and/or devices. Each of the BSs 170 operates to transmit and/or receive wireless signals within a particular geographic region or area, sometimes referred to as a "cell." In some embodiments, multiple-input multiple-output (MIMO) technology may be employed having multiple transceivers for each cell.

The BSs 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the BSs 170 and UEs 110 are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120 are in communication with the core network 130 to provide the UEs 110 with voice, data, application, Voice over Internet Protocol (VoIP), or other services. As appreciated, the RANs 120 and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

The RANs 120 may also include millimeter and/or microwave access points (APs). The APs may be part of the BSs 170 or may be located remote from the BSs 170. The APs may include, but are not limited to, a connection point (an mmW CP) or a BS 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

FIG. 2 illustrates example details of a UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure, the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 204 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

Certain embodiments of the present technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

FIG. 4 illustrates example details of a transmitter 402, which can be the transmitter 202 included in the UE 110 (shown in FIG. 2) or the transmitter 302 included in the BS 170 (shown in FIG. 3), but is not limited thereto. Components of the transmitter 402 can alternatively be components of a transceiver. Referring to FIG. 4, the transmitter 402 is shown as including a digital-to-analog converter (DAC) 414, a filter 416, a mixer 418, a local oscillator 420, a transimpedance amplifier (TIA) 422, one or more power amplifiers (PAs) 424, a reference signal generator 426, and a filter 428. The DAC 414 is shown as receiving a digital voice and/or data signal from a baseband processor 408, which can be the processor 208 in the UE 110 (shown in FIG. 2) or the processor 308 in the BS 170 (shown in FIG. 3). The DAC 414 converts the digital voice and/or data signal it receives from the baseband processor 408 to an analog voice and/or data signal. The filter 416 filters the analog signal that is output by the DAC 414 to, e.g., remove noise that results from the digital to analog conversion that is performed by the DAC 414. The filtered analog signal that is output from the filter 416 is provided to the mixer 418. The mixer 418, in addition to receiving the filtered analog signal from the filter 416, also receives an oscillator signal from the local oscillator (LO) 420, and adjusts the frequency of the filtered analog signal, from a first frequency to a second frequency that is higher than the first frequency. More specifically, the mixer 418 can be an up-mixer (UP MIX) that frequency up-converts the filtered analog signal from a relatively low baseband frequency to a higher RF frequency that is offset from the baseband frequency.

Still referring to FIG. 4, the frequency up-converted RF signal that is output from the mixer 418 is shown as being provided to the trans-impedance amplifier (TIA) 422. The TIA 422 acts as a current buffer to isolate the one or more PAs 424 that is/are downstream of the TIA 422, from the mixer 418 that is upstream of the TIA 422. The one or more PAs 424 amplify the frequency up-converted RF signal, which can also be referred to more succinctly as the RF signal, so that the RF signal that is eventually transmitted by an antenna 410 has sufficient power to be transmitted from UE to a BS, or vice versa (depending upon whether the transmitter 402 is within UE or a BS). To provide sufficient amplification, multiple PAs 424 may be used, to provide for multiple stages of power amplification. The one or more PAs 424 output an amplified RF signal that is filtered by the filter 428 before being provided, via a TX/RX switch or duplexer 403, to the antenna 410 for transmission. The filter 428 can be, e.g., a high pass filter or a bandpass filter that filters the amplified frequency up-converted RF signal to remove low frequency and/or other signal components that are not of interest, such as LF noise.

Although not specifically shown in FIG. 4, the baseband processor 408, the transmitter 402, and the receiver 404, can each include its own respective RF Front End (RFFE) module that enables them to communicate with one another via a bi-directional RFFE bus 411. Such RFFE modules can each also receive a common clock (CLK) signal that is used to synchronize the baseband processor 408, the transmitter 402, and the receiver 404, with one another. The RFFE modules can be used to configure the various components for certain modes of operation, and can be used, e.g., to control that gain of RF signals that are to be transmitted via the antenna 410.

As shown in FIG. 4, each of the PAs 424 receives a reference signal 427 from the reference signal generator 426. In accordance with certain embodiments of the present technology, such reference signals 427 are used to reduce and preferably minimize undesirable gain variation of each PA 424, so as to reduce and preferably minimize the distortion caused by the PAs 424. This is not to say that the gain of the PAs 424 cannot be purposely adjusted, e.g., as part of a protocol that is meant to keep a bit error rate (BER) or some other measure of signal quality within an acceptable level and/or to conserve power. Indeed, there will be times where the gain of a PA 424 is purposely increased to improve signal quality, or purposely reduced to conserve power and/or reduce interference with other communication signals, as just a few examples. The gain at which a PA 424 is instructed or set to operate can be referred to herein as the "gain setting" for the PA 424. Embodiments of the present technology can be used to reduce and preferably minimize undesirable gain variation of a PA 424 that is set to operate at a gain setting.

The gain of a PA 424 can be changed, for example, by adjusting the reference signal 427 that is provided to a reference input of the PA 424. More specifically, the gain of a PA 424 can be purposefully increased by purposefully increasing the magnitude of the reference signal 427 provide to the PA 424, and the gain of a PA 424 can be purposefully decreased by purposefully decreasing the magnitude of the reference signal 427 provided to the PA 424. Depending upon how the one or more PAs 424 are implemented, the reference signals 427 provided to the PAs 424 can be current reference signals or voltage reference signals. For the remainder of this discussion, unless stated otherwise, it will be assumed that the reference signals 427 provided to the one or more PAs 424, which are used to control the gain of the PAs 424, are current reference signals. However, it should be understood that in alternative embodiments the reference signals 427 can instead by voltage reference signals.

The gain of a PA 424 can also be unintentionally changed (i.e., unintentionally increased or decreased) due to changes in the temperature. For example, significant increases in temperature can cause the gain of a PA 424 to decrease. For a more specific example, assume that a PA 424 has a gain setting of 30 dB. At 25 degrees Celsius (° C.) the gain of the PA 424 can be maintained at substantially 30 dB. However, if the temperature of the PA 424 is increased from 25 to 85° C., the gain of the PA 424 may drop by over 20% to less than 24 dB, which is undesirable. Certain embodiments of the present technology described herein can be beneficially used to maintain the gain of each PA 424 to within +/−2 dB of a specified gain setting over a wide range of temperatures (e.g., over a range of at least 50° C.).

Figure 5:
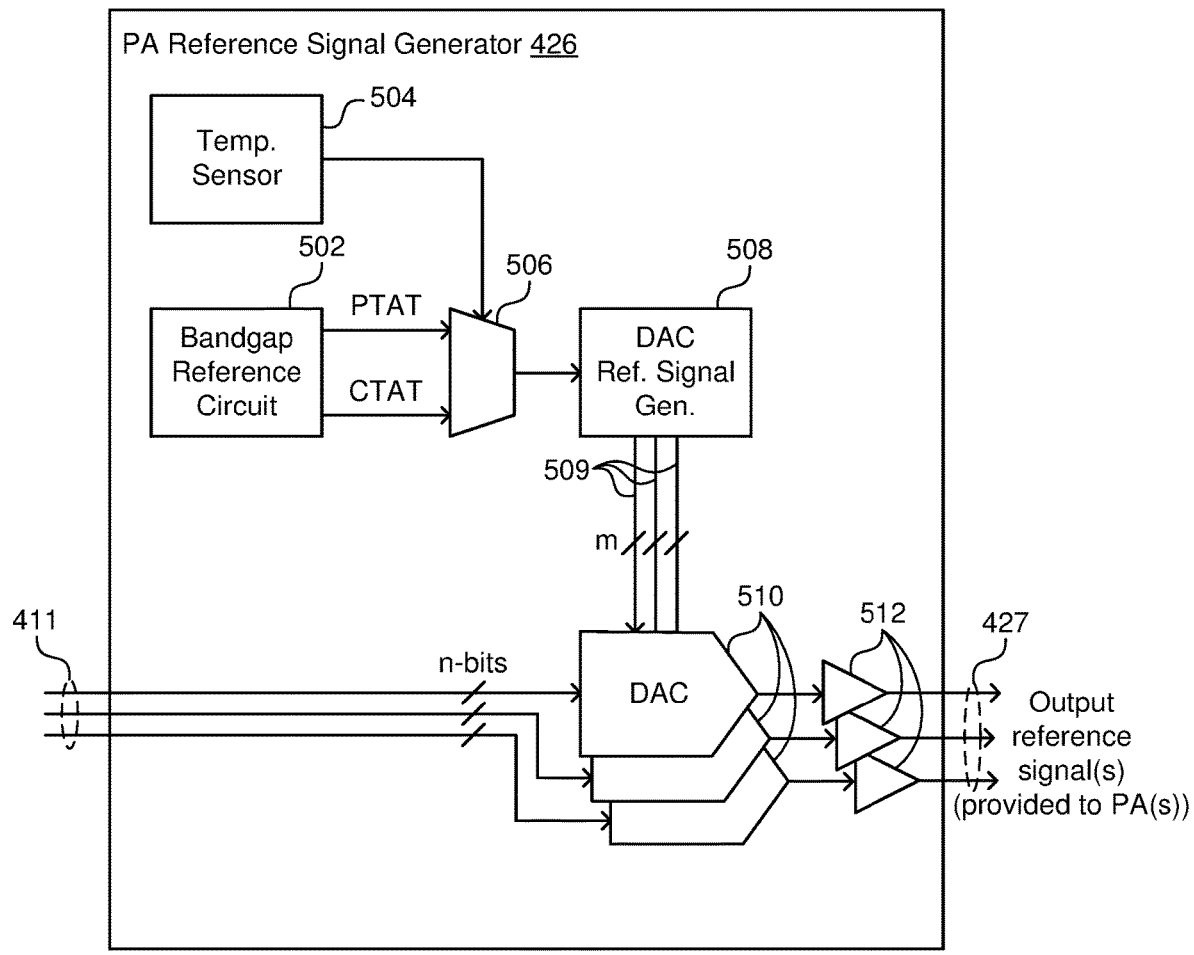
FIG. 5 illustrates example details of the power amplifier (PA) reference signal generator included in the transmitter illustrated in FIG. 4.

Additional detail of the reference signal generator 426, according to certain embodiments of the present technology, will now be described with reference to FIG. 5. Since the reference signal generator 426 is configured to produce one or more reference signals for one or more PAs, the reference signal generator 426 can also be referred to more specifically as the PA reference signal generator 426. For a similar reason, a reference signal 427 can be referred to more specifically as a PA reference signal 427. The circuitry shown in FIG. 5, or just a portion thereof, can also be referred to more generally as a subsystem configured to produce a reference signal that is provided to a PA of an RF transmitter or transceiver. Referring to FIG. 5, the PA reference signal generator 426 is shown as including a bandgap reference circuit 502, a temperature sensor 504, a switch 506, a DAC reference signal generator 508, DACs 510, and amplifiers 512. Each DAC 510 is shown as receiving an n-bit gain setting signal at its digital input, receiving m reference signals at its m reference inputs (where m is an integer that is greater than or equal to one), and outputting a reference signal that after being amplified by a respective amplifier 512 is provided to a reference input of one of the PAs 424. The n-bit gain setting signal that is provided to the digital input of a DAC 510 can be provided by an RFFE module, or the like. The m reference signals 509, which are provided to the reference input(s) of each DAC 510, are generated by the DAC reference signal generator 508, an exemplary implementation of which is described below with reference to FIG. 7. While the temperature sensor 504, the bandgap reference circuit 502, and the switch 506 are shown in FIG. 5 as being part of the PA reference signal generator 426, one or more of these components can alternatively be external to the PA reference signal generator 426, depending upon implementation.

The temperature sensor 504 can be a thermistor, a resistance thermometer, a thermocouple, or a semiconductor-based temperature sensor, but is not limited thereto. Where the temperature sensor 504 is a semiconductor-based temperature sensor it can share circuitry with the bandgap reference circuit 502, as would be appreciated by one of ordinary skill in the art. The output of the temperature sensor 504 is shown as being used to control the switch 506 that provides a selected one of the PTAT signal or the CTAT signal to the DAC reference signal generator 508. The output of the temperature sensor 504 can be referred to as a temperature indication signal. In certain embodiments, the temperature indication signal (output by the temperature sensor 504) has a value or magnitude that is indicative of a temperature sensed by the temperature sensor 504. In such embodiments, the temperature indication signal can be compared to a threshold value or magnitude, using a comparator (not shown), and the output of the comparator can be used to control the switch 506. Alternatively, the temperature sensor 504 can have a binary output, i.e., can have one of two binary states based on whether the sensed temperature is below or above the threshold temperature. Other variations are also possible and within the scope of the embodiments described herein. The temperature sensor 504 is preferably in close enough proximity to the PAs 424 such that the temperature indication signal produced by the temperature sensor 504 is indicative of the temperature of the PAs 424. This goal can be achieved by designing the layout appropriately.

The bandgap reference circuit 502 is shown as producing a proportional to absolute temperature (PTAT) signal and a complimentary to absolute temperature (CTAT) signal. The PTAT and CTAT signals can be voltage signals in which the magnitude of the voltages of such signals are either proportional to absolute temperature or complimentary to absolute temperature. Where the CTAT and PTAT signals are voltage signals, they can also be referred to respectively as VCTAT and VPTAT signal. Alternatively, the PTAT and CTAT signals can be current signals in which case the magnitude of the currents of such signals are either proportional to absolute temperature or complimentary to absolute temperature. In FIG. 5 the same circuit (namely the bandgap reference circuit 502) is shown as producing both the PTAT and CTAT signals. In alternatively embodiments, separate circuits can be used to produce the PTAT and CTAT signals. For example, a PTAT circuit can produce the PTAT signal, and a CTAT circuit can produce the CTAT signal, wherein the PTAT and CTAT circuits may or may not share some of the same circuitry, depending upon the specific implementation. Examples of bandgap reference circuits that can be used to produce both the PTAT and CTAT signals are described below with reference to FIGS. 6A and 6B. However, it is noted that these are just examples, and embodiments of the present technology are not intended to be limited to use with the bandgap reference circuits shown in FIGS. 6A and 6B.

Still referring to FIG. 5, the PTAT and CTAT signals are shown as being provided to the switch 506, which is used to select between providing either the PTAT signal or the CTAT signal to the DAC reference signal generator 508. In the embodiment shown in FIG. 5, the switch 506 is shown as being implemented as a multiplexer. However other types of switches, such as, but not limited to, a single pole double throw (SPDT) switch can be used in place of a multiplexer. In other words, the switch 506 can be implemented in various different manners using various different types of circuitry, depending upon implementation.

As noted above, each DAC 510 receives an n-bit gain setting signal, which the DAC 510 converts from a digital gain setting signal to an analog gain setting signal. The analog gain setting signal that is output by each DAC 510 is provided to a respective amplifier 512, which amplifies the analog gain setting signal to an appropriate level for being used as a reference signal for one of the PAs 424 discussed above with reference to FIG. 4. There can be one DAC 510 and respective amplifier 512 for each PA 424, such that if the transmitter 402 includes three PAs 424, then the reference signal generator 426 shown in FIG. 5 will include three DACs 510 and three amplifiers 512, as shown in FIG. 5. It would also be possible to eliminate the amplifiers 512 if the DACs 510 produce outputs within a desirable amplitude range without use of the amplifiers 512.

Each DAC 510 can be implemented, e.g., as a thermometer-coded DAC, a binary-weighted DAC, or a hybrid DAC (which is a combination of a thermometer-coded DAC and a binary-weighted DAC), but is not limited thereto. The number and types of reference signals that each DAC 510 receives will depend on the specific way the DAC 510 is implemented, as would be understood by one of ordinary skill in the art. Each DAC 510 receives, at the digital input of the DAC, an n-bit digital input signal, which as noted above, can be a gain setting signal. Each DAC 510 also receives, at one or more reference inputs of the DAC, one or more analog DAC reference signals that are generated by the DAC reference signal generator 508. Such DAC reference signals(s) is/are used to bias each DAC 510. All of the DACs 510 can receive the same DAC reference signals, or the DAC references signals received by each of the DACs 510 can differ from one another, depending upon the implementation. Further, each DAC 510 outputs, at the analog output of the DAC, an analog output signal that the DAC produces based on the n-bit digital input signal and the one or more DAC reference signals that are provided to the DAC 510. The analog output signal that is output at the analog output of the DAC, or more specifically an amplified version thereof, is the reference signal that is provided to one of the one or more PAs 424 discussed above with reference to FIG. 4. When the DAC 510 receives a signal, it can also be said that the DAC accepts the signal. In other words, the terms receive and accept are used interchangeably herein.

Figure 6A:
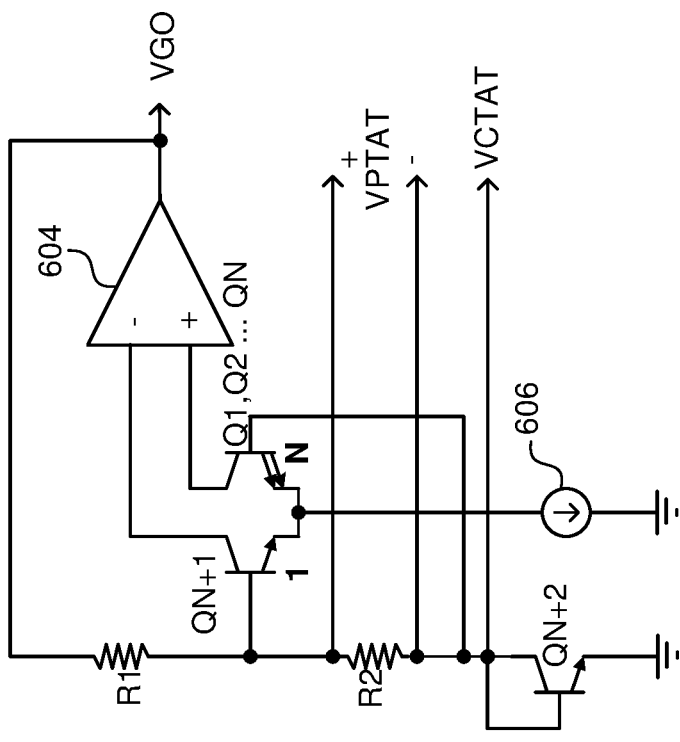
FIGS. 6A and 6B illustrate examples of bandgap reference circuits that can be included in the PA reference signal generator illustrated in FIG. 5.

FIG. 6A illustrates an exemplary implementation of the bandgap reference circuit 602a, which can be used as the bandgap reference circuit 502 in FIG. 5. The bandgap reference circuit 602a in FIG. 6A includes N+1 transistors, including diode connected transistors Q1 through QN connected in parallel, a further diode connected transistor QN+1, a differential input amplifier 604, a pair of resistors R1, and a resistor R2. In this arrangement, the transistor QN+1 is used to generate a VCTAT signal, and transistors Q1 through QN in conjunction with transistor Qn+1 are used to generate a VPTAT signal. More specifically, the VCTAT signal is a function of the base emitter voltage (VBE) of transistor QN+1, and the VPTAT signal is a function of ΔVBE, which is a function of the difference between the base-emitter voltage of transistor QN+1 and the base-emitter voltage of parallel connected transistors Q1 through QN. The bandgap reference circuit 602a also produces a bandgap voltage output (VGO), wherein VGO=VBE+(R1/R2)*Vt*In(N). If VBE~0.7V, and (R1/R2)*Vt*In(N)~0.5V, then VGO~1.2V. The VGO can be used to provide a constant reference voltage to circuits that require one to operate properly.

Figure 6B:
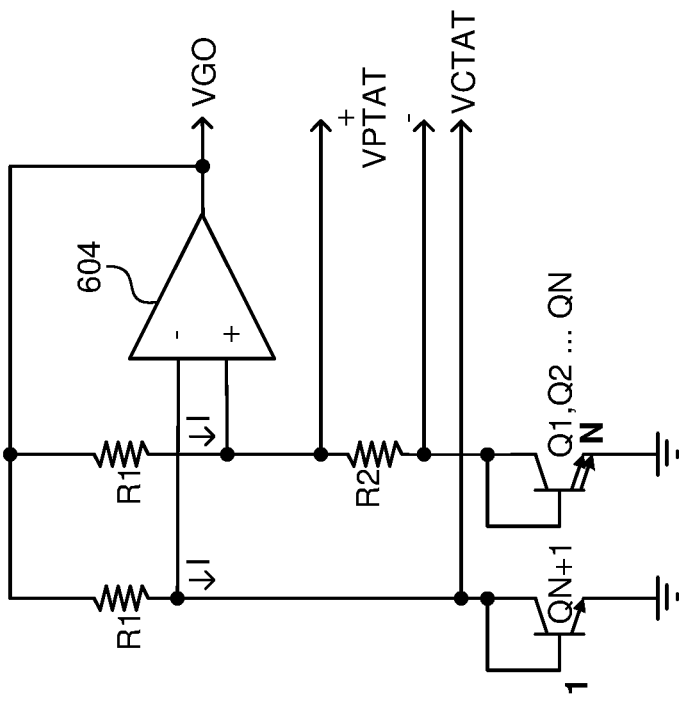

FIG. 6B illustrates an alternative implementation of the bandgap reference circuit 602b, which can be used as the bandgap reference circuit 502 shown in FIG. 5. The bandgap reference circuit 602b in FIG. 6B includes transistors Q1 through QN connected in parallel, a further transistor QN+1, a differential input amplifier 604, a resistor R1, a resistor R2, a diode connected transistor QN+2, and a current sink 604. In this arrangement, the transistor QN+2 is used to generate a VCTAT signal, and transistors Q1 through QN+1 are used to generate a VPTAT signal. The bandgap reference circuit 602b also produces a bandgap voltage output (VGO), which can be used to provide a constant reference voltage to circuits that require one to operate properly.

The bandgap reference circuits 602a and 602b shown in FIGS. 6A and 6B have been included only as examples, as there are numerous alternative types of bandgap reference circuits that can be used to produce VPTAT and VCTAT signals, or alternatively, PTAT and CTAT signals that are current signals rather than voltage signals. Such alternative types of bandgap reference circuits may or may not include an amplifier, such as the differential input amplifier 604, as is known in the art. Further, as noted above, separate circuits can be used to produce the PTAT and CTAT signals. For example, a PTAT circuit can produce the PTAT signal, and a CTAT circuit can produce the CTAT signal, wherein the PTAT and CTAT circuits may or may not share some circuitry, depending upon the specific implementation.

Figure 7:
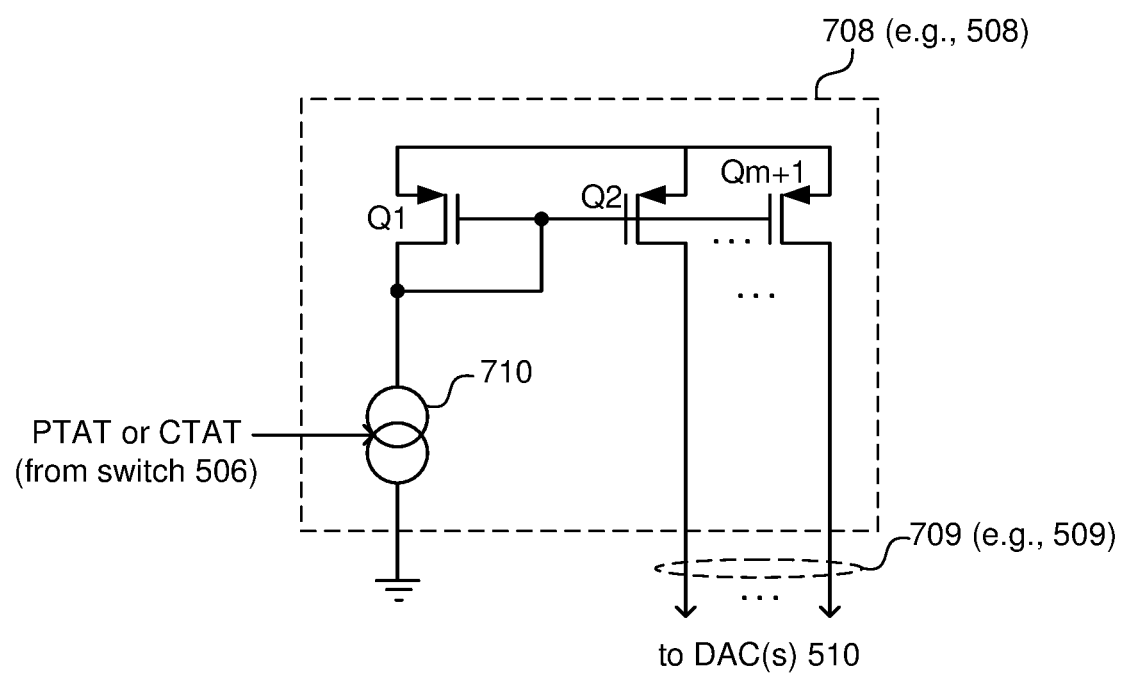
FIG. 7 illustrates example details of the DAC reference signal generator illustrated in FIG. 5, accordance to an embodiment of the present technology.

FIG. 7 illustrates a DAC reference signal generator 708, which can be used to implement the DAC reference signal generator 508 illustrated in FIG. 5, accordance to an embodiment of the present technology. Referring to FIG. 7, the DAC reference signal generator 708 is shown as including an adjustable current source 710 and a plurality of transistors Q1, Q2 . . . Qm+1. The transistors Q1, Q2 . . . Qm+1 are PMOS transistors that are connected as a current mirror. More specifically, the sources of the transistors Q1, Q2 . . . Qm+1 are connected to a high voltage rail (e.g., VDD), and the gate and drain of the transistor Q1 are connected together and provide an input of the current mirror. The gates of each of the transistors Q1, Q2 . . . Qm+1 are connected together. The signals 709 generated at the drains of the transistors Q2 . . . Qm+1 can be the m reference signals (aka the DAC reference signals 509) that are provided to the one or more DACs 510 shown in FIG. 5. If the sizes of the transistors Q2 . . . Qm+1 are all substantially the same, then the DAC reference signals 509 generated at the drains of the transistors Q2 . . . Qm+1 will all have substantially the same magnitude. Alternatively, different ones of the transistors Q2 . . . Qm+1 can have different sizes, so as to generate DAC reference signals 509 of different magnitudes, as desired, depending upon how the DAC(s) 510 is/are implemented and require biasing.

Still referring to FIG. 7, the adjustable current source 710 is shown as being controlled by one of the PTAT or CTAT signals, or more specifically, by the one of the PTAT or CTAT signals that is provided to the adjustable current source 710 by the switch 506 shown in FIG. 5. In this manner, one of the PTAT or CTAT signals is used to generate the DAC reference signals 709 (e.g., 509).

Figure 8:
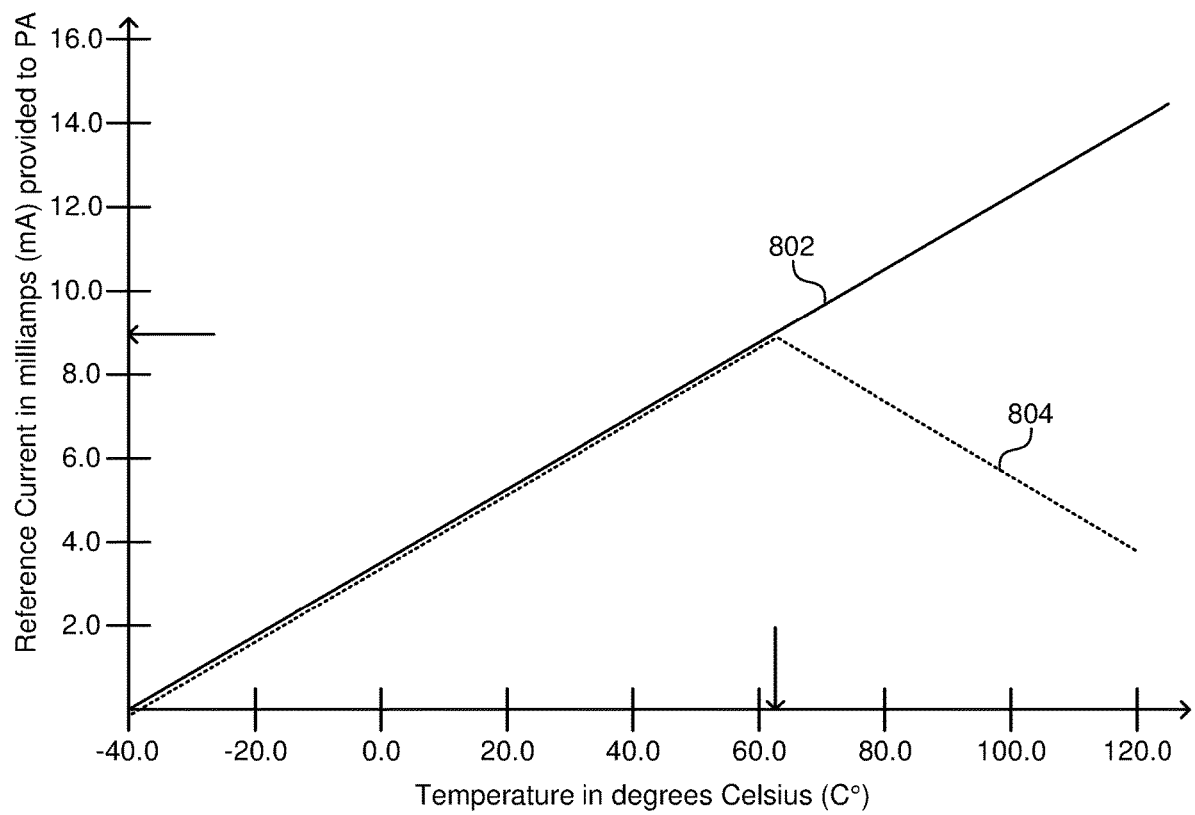
FIG. 8 is a graph of reference current versus temperature, which is used to describe how reference currents used to bias a PA can be affected by changes in temperature, and thus, that a gain of the PA can be adversely affected by changes in temperature.

FIG. 8 is a graph showing results of a simulation that plots reference current versus temperature. FIG. 8 is used to illustrate how a current reference signal provided to a PA can be affected by changes in temperature. The solid line 802 shows the behavior of a reference current when a PTAT signal (but not a CTAT signal) is used to produce the current reference current for a PA. The dotted line 804 shows the behavior of a reference current signal provided to a PA when both a PTAT signal and a CTAT signal are used to produce the current reference signal for the PA. In this particular simulation, the change in temperature-based functionality occurred at +64° C. (as shown by the vertical arrow) when the reference current was 9 mA (as shown by the horizontal arrow). In other words, the temperature threshold at which there was a change from using the PTAT signal to the CTAT signal was +64° C. Circuitry can be adjusted such that this temperature-based functionality change can be made to occur at any temperature and for any value of the reference current signal.

Figure 9:
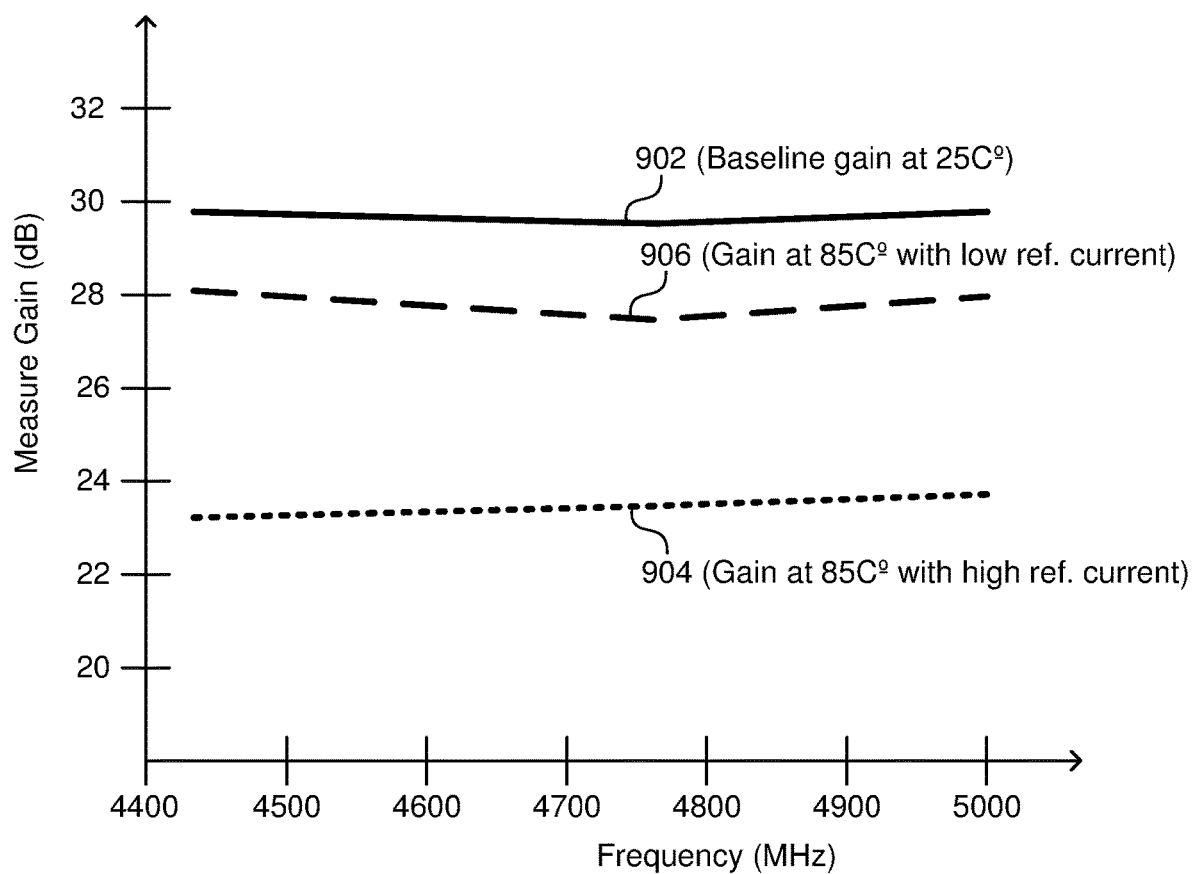
FIG. 9 is a graph of gain versus frequency, which is used to describe how the gain of a PA can be affected by changes in temperature, and how embodiments of the present technology can be used to reduce the extent to which changes in temperature affect the gain of a PA.

FIG. 9 is a graph of gain versus frequency, which is used to describe how the gain of a PA can be affected by changes in temperature, and how embodiments of the present technology can be used to reduce the extent to which changes in temperature affect the gain of the PA. The solid line 902 is a plot of the measured gain of the PA at 25° C., which is presumed to be room temperature and is used as a baseline. The dotted line 904 illustrates how the gain decreases by more than 20%, from about 30 dB to below 24 dB, when the temperature increases from 25° C. to 85° C. and a relatively high reference current (e.g., 5 mA) is provided to the PA. The dashed line 906 illustrates how the gain at 85° C. can be made much closer to the 30 dB gain at baseline by using a lower reference current (e.g., about 2.2 mA). In other words, FIG. 9 illustrates that when a higher reference current, such as 5 mA, is used at 85° C. (a relative hot temperature) the gain degraded significantly as shown by the dotted line 904, where the degradation was by about 6 dB. When a much lower reference current, such as 2.2 mA, was used at 85° C. the gain degradation was reduced to about 2 dB as shown by the dashed line 906. This proves that for an RF PA design, reducing the reference bias current at high temperatures was useful in reducing the PA gain variation. This is beneficial, because one of the objectives of RF PA design is to minimize the gain variation of the RF PA over variations in temperature.

Figure 10:
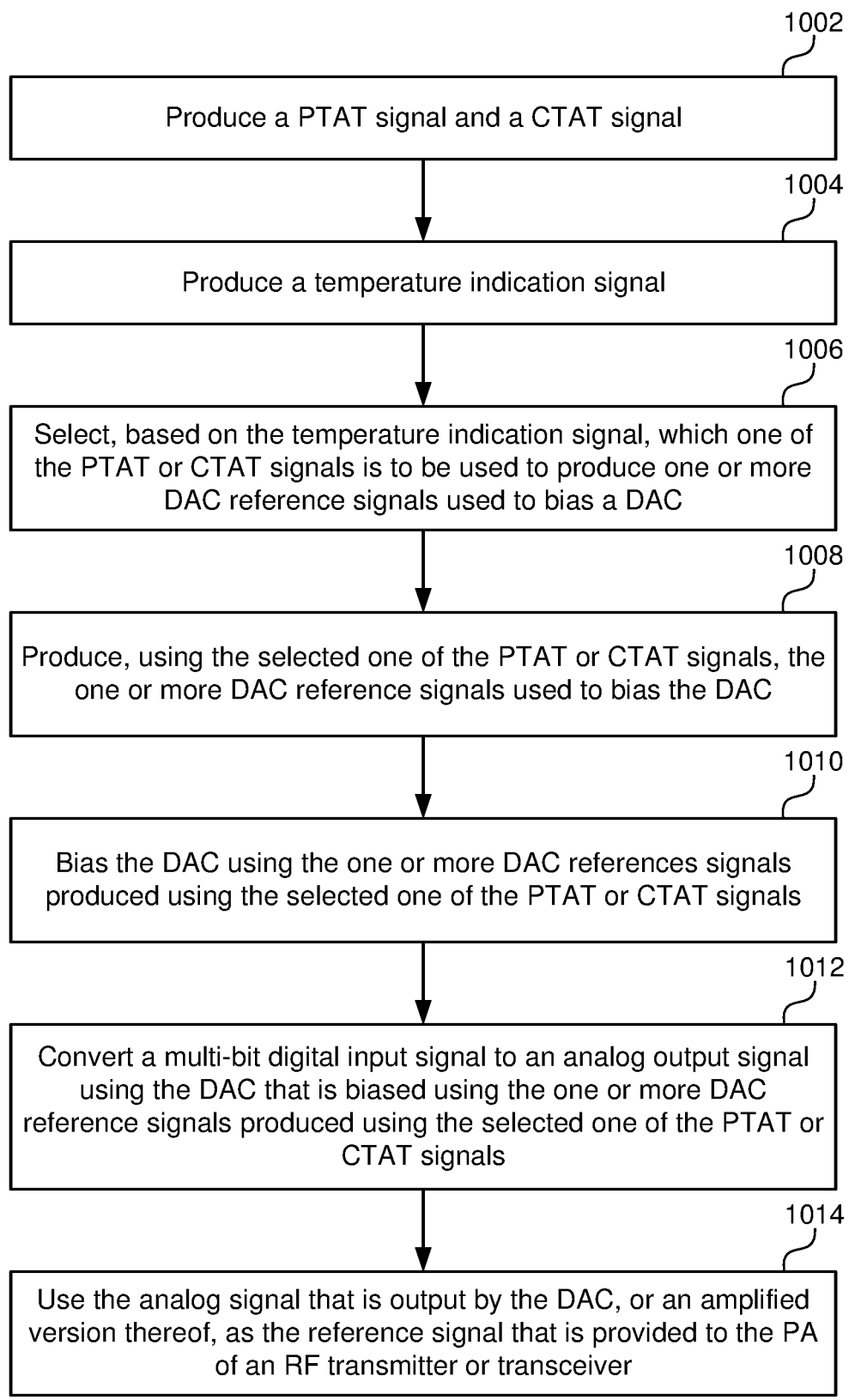
FIG. 10 is a high-level flow diagram that is used to summarize methods according to various embodiments of the present technology.

FIG. 10 is a high-level flow diagram that is used to summarize methods according to various embodiments of the present technology. Such methods can be used for providing a reference signal to a PA (e.g., 424 in FIG. 4) of an RF transmitter or transceiver (e.g., 202 in FIG. 2, 302 in FIG. 3, or 402 in FIG. 4).

Referring to FIG. 10, step 1002 involves producing a PTAT signal and a CTAT signal. Step 1002 can be performed, e.g., by a bandgap reference circuit, such as, but not limited to, the bandgap reference circuits 502, 602a, or 602b described above with reference to FIGS. 5, 6A and 6B, or by separate PTAT and CTAT circuits.

Step 1004 involves producing a temperature indication signal. Step 1004 can be performed, e.g., by the temperature sensor 504 described above with reference to FIG. 5. In certain embodiments, the temperature indication signal has one of two binary states based on whether the sensed temperature is below or above a threshold temperature. In other embodiments, an output of the temperature sensor can have value or magnitude that is indicative of (e.g., proportional to) the actual temperature, and the value or magnitude can be compared to a threshold value or magnitude using a comparator, and the output of the comparator can be used at step 1006 discussed below. In this latter embodiment, the output of the temperature sensor, or the output of the comparator, can be considered the temperature indication signal.

Step 1006 involves selecting, based on the temperature indication signal, which one of the PTAT or CTAT signals is to be used to produce one or more DAC reference signals that are used to bias a DAC, e.g., one of the DACs 510. Step 1006 can be performed, e.g., using the switch 506 described above with reference to FIG. 5

Step 1008 involves producing, using the selected one of the PTAT or CTAT signals, the one or more DAC reference signals that are used to bias the DAC. Step 1008 can be performed by the DAC reference signal generator 508 or 708, described above with reference to FIGS. 5 and 7.

Step 1010 involves biasing the DAC (e.g., 510) using the one or more reference signals produced using the selected one of the PTAT or CTAT signals.

Step 1012 involves converting a multi-bit digital input signal (e.g., a gain setting signal) to an analog output signal using the DAC (e.g., 510) that is biased using the one or more DAC reference signals produced using the selected one of the PTAT or CTAT signals.

Step 1014 involves using the analog signal that is output by the DAC (e.g., 510), or an amplified version thereof (e.g., produced using an amplifier 512 in FIG. 5), as the reference signal that is provided to the PA (e.g., 424 in FIG. 4) of the RF transmitter or transceiver (e.g., a TX 202, 302 or 402 in FIGS. 2, 3, and 4).

The methods summarized with reference to FIG. 10 can be used to reduce how much the gain of the PA varies in dependence on changes in temperature of the PA. More specifically, by selecting, based on the temperature indication signal, which one of the PTAT or CTAT signals is to be used to produce one or more DAC reference signals that are used to bias the DAC, how much the gain of the PA varies in dependence on the change in the temperature of the PA can be reduced compared to if a same one of the PTAT or CTAT signals was always used to produce the one or more reference signals.

In certain embodiments described above, when a sensed temperature is below a threshold, a PTAT signal is selected to be used to produce one or more DAC reference signals used to bias a DAC (e.g., 510) that produces a PA reference signal (e.g., 427) used to bias a PA (e.g., 424); and when the temperature is above the temperature threshold a CTAT signal is selected to be used to produce the one or more DAC reference signals used to bias the DAC (e.g., 510) that produces the PA reference signal (e.g., 427) used to bias the PA (e.g., 424). In alternative embodiments, the above is reversed. More specifically, in alternative embodiments, when the temperature is below the temperature threshold a CTAT signal is selected to be used to produce one or more DAC reference signals used to bias a DAC (e.g., 510) that produces a PA reference signal (e.g., 427) used to bias a PA (e.g., 424); and when the temperature is above the temperature threshold a PTAT signal is selected to be used to produce the one or more DAC reference signals used to bias the DAC (e.g., 510) that produces the PA reference signal (e.g., 427) used to bias the PA (e.g., 424). More generally, one of a PTAT signal or a CTAT signal can be used to generate one or more reference signals used to bias certain circuitry when a temperature is above a temperature threshold, and the other one of the PTAT or CTAT signals can be used to generate the one or more reference signals used to bias certain circuitry when the temperature is above the temperature threshold.

In certain embodiments described above, both PTAT and CTAT signals are simultaneously produced (e.g., using a bandgap reference circuit that produces both the PTAT and CTAT signal, or using separate PTAT and CTAT circuits), and based on a temperature indication signal (e.g., produced by the temperature sensor 504), a switch (e.g., 506) is controlled to select one of the PTAT or CTAT signals to use for generating one or more reference signals that are used to bias further circuitry. In alternative embodiments, where there are separate PTAT and CTAT circuits, the PTAT and CTAT signals need not be produced simultaneously. Rather, in certain alternative embodiments, only one of the PTAT circuit and the CTAT circuit is enabled at a time based on whether a sensed temperature is above or below a threshold. Both types of embodiments can include circuitry configured to provide one of a PTAT signal or a CTAT signal to a reference signal generator based on a temperature indication signal.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on." It is also noted that the term "based on" and "in dependence on" are used interchangeably herein.

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope be defined by the claims appended hereto.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A subsystem configured to produce a current reference signal that biases a power amplifier (PA) of a radio frequency (RF) transmitter or transceiver, wherein a gain of the PA varies in response to a change in a temperature of the PA, the subsystem comprising:
   one or more circuits configured to produce a proportional to absolute temperature (PTAT) signal and a complimentary to absolute temperature (CTAT) signal;
   a digital-to-analog converter (DAC) that produces the current reference signal that biases the PA of RF transmitter or transceiver, the DAC including a digital input, one or more reference inputs, and an analog output, the DAC configured to
      receive, at the digital input of the DAC, a multi-bit digital input signal,
      receive, at the one or more reference inputs of the DAC, one or more DAC reference signals that bias the DAC, and
      output, at the analog output of the DAC, an analog output signal that the DAC produces based on the multi-bit digital input signal and the one or more DAC reference signals that bias the DAC,
      wherein the analog output signal that is output at the analog output of the DAC, or an amplified version thereof, comprises the current reference signal that biases the PA;
   a DAC reference signal generator configured to produce, based on one of the PTAT or CTAT signals, the one or more DAC reference signals that are provided to the one or more reference inputs of the DAC to bias the DAC;
   a temperature sensor configured to produce a temperature indication signal; and
   circuitry configured to provide one of the PTAT signal or the CTAT signal to the DAC reference signal generator based on the temperature indication signal, such that the one or more DAC reference signals that bias the DAC are produced based on the PTAT signal when the PTAT signal is provided to the DAC reference signal generator, and the one or more DAC reference signals that bias the DAC are produced based on the CTAT signal when the CTAT signal is provided to the DAC reference signal generator;
   wherein use of the temperature indication signal to selectively provide one of the PTAT or CTAT signals to the DAC reference signal generator reduces how much the gain of the PA varies in response to the change in the temperature of the PA compared to if a same one of the PTAT or CTAT signals was always provided to the DAC reference signal generator.

2. The subsystem of claim 1, wherein the circuitry configured to provide one of the PTAT signal or the CTAT signal to the reference signal generator based on the temperature indication signal, comprises a switch, and wherein the switch comprises one of a multiplexer or a single pole double throw switch.

3. The subsystem of claim 1, wherein the circuitry configured to provide one of the PTAT signal or the CTAT signal to the reference signal generator based on the temperature indication signal, is configured to:
   provide one of the PTAT or CTAT signals to the DAC reference signal generator when the temperature indication signal is indicative of a temperature sensed by the temperature sensor being below a threshold temperature; and
   provide the other one of the PTAT or CTAT signals to the DAC reference signal generator when the temperature indication signal is indicative of the temperature sensed by the temperature sensor being above the threshold temperature.

4. The subsystem of claim 1, wherein:
the temperature sensor is configured to cause the temperature indication signal to have one of two binary states based on whether the sensed temperature is below or above a threshold temperature.

5. The subsystem of claim 1, wherein:
the one or more circuits configured to produce the PTAT and CTAT signals comprise a bandgap reference circuit that produces both the PTAT and CTAT signals.

6. The subsystem of claim 5, wherein:
the temperature sensor comprises at least a portion of the bandgap reference circuit that produces both the PTAT and CTAT signals.

7. The subsystem of claim 1, wherein:
the one or more circuits configured to produce the PTAT and CTAT signals comprise a first circuit configured to produce the PTAT signal and a second circuit configured to produce the CTAT signal.

8. The subsystem of claim 1, wherein the current reference signal that biases the PA comprises an amplified version of the analog output signal that is output at the analog output of the DAC.

9. A method for providing a current reference signal to bias a power amplifier (PA) of a radio frequency (RF) transmitter or transceiver, wherein a gain of the PA varies in response to a change in a temperature of the PA, the method comprising:
   producing a temperature indication signal;
   selecting, based on the temperature indication signal, one of a proportional to absolute temperature (PTAT) signal or a complimentary to absolute temperature (CTAT) signal;
   using the selected one of the PTAT or CTAT signals to produce one or more DAC reference signals that are used to bias a digital-to-analog converter (DAC);
   biasing the DAC using the one or more DAC reference signals produced using the selected one of the PTAT or CTAT signals;
   converting a multi-bit digital input signal to an analog output signal using the DAC that is biased using the one or more DAC reference signals produced using the selected one of the PTAT or CTAT signals; and
   using the analog signal that is output by the DAC, or an amplified version thereof, as the current reference signal that biases the PA of the RF transmitter or transceiver;
   wherein the selecting, based on the temperature indication signal, which one of the PTAT or CTAT signals used to produce the one or more DAC reference signals that bias the DAC reduces how much the gain of the PA varies in response to the change in the temperature of the PA compared to if a same one of the PTAT or CTAT signals was always used to produce the one or more DAC reference signals.

10. The method of claim 9, further comprising:
producing the PTAT signal and the CTAT signal; and
wherein the selecting is performed using a switch that is controlled based on the temperature indication signal.

11. The method of claim 9, wherein the selecting comprises:
- selecting one of the PTAT or CTAT signals when the temperature indication signal is indicative of a sensed temperature being below a threshold temperature; and
- selecting the other one of the PTAT or CTAT signals when the temperature indication signal is indicative of the sensed temperature being above the threshold temperature.

12. The method of any claim 9, wherein:
- producing the temperature indication signal comprises sensing a temperature and causing the temperature indication signal to have one of two binary states based on whether the sensed temperature is below or above a threshold temperature.

13. The method of claim 9, wherein:
- the PTAT and CTAT signals are simultaneously produced using a same bandgap reference circuit.

14. The method of claim 9, wherein:
- the PTAT signal is produced using a first circuit and the CTAT signal is produced using a second circuit.

15. The method of claim 9, wherein the current reference signal that biases the PA of the RF transmitter or transceiver comprises an amplified version of the analog output signal that is output by the DAC.

\* \* \* \* \*

UNITED STATES PATENT AND TRADEMARK OFFICE
CERTIFICATE OF CORRECTION

PATENT NO. : 12,166,515 B2
APPLICATION NO. : 17/687455
DATED : December 10, 2024
INVENTOR(S) : M. Nag Page 1 of 1

It is certified that error appears in the above-identified patent and that said Letters Patent is hereby corrected as shown below:

In the Claims

Column 21, Line 10 (Claim 12, Line 1), please change "of any claim 9" to -- of claim 9 --.

Signed and Sealed this
Eleventh Day of February, 2025

Coke Morgan Stewart
*Acting Director of the United States Patent and Trademark Office*